United States Patent
Loubet et al.

(10) Patent No.: US 9,263,343 B2
(45) Date of Patent: Feb. 16, 2016

(54) DUAL EPI CMOS INTEGRATION FOR PLANAR SUBSTRATES

(71) Applicants: STMicroelectronics, Inc., Coppell, TX (US); International Business Machines Corporation, Armonk, NY (US)

(72) Inventors: Nicolas Loubet, Guilderland, NY (US); Balasubramanian Pranatharthiharan, Watervliet, NY (US)

(73) Assignees: STMicroelectronics, Inc., Coppell, TX (US); International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/327,343

(22) Filed: Jul. 9, 2014

(65) Prior Publication Data

US 2015/0011060 A1   Jan. 8, 2015

Related U.S. Application Data

(62) Division of application No. 13/679,434, filed on Nov. 16, 2012, now Pat. No. 8,836,041.

(51) Int. Cl.

| | |
|---|---|
| *H01L 21/8238* | (2006.01) |
| *H01L 29/161* | (2006.01) |
| *H01L 27/092* | (2006.01) |
| *H01L 21/02* | (2006.01) |
| *H01L 21/265* | (2006.01) |
| *H01L 21/266* | (2006.01) |
| *H01L 21/3065* | (2006.01) |
| *H01L 21/308* | (2006.01) |
| *H01L 29/66* | (2006.01) |

(52) U.S. Cl.
CPC .. *H01L 21/823814* (2013.01); *H01L 21/02532* (2013.01); *H01L 21/266* (2013.01); *H01L 21/26513* (2013.01); *H01L 21/308* (2013.01); *H01L 21/3065* (2013.01); *H01L 21/823878* (2013.01); *H01L 27/092* (2013.01); *H01L 29/161* (2013.01); *H01L 29/6656* (2013.01)

(58) Field of Classification Search
CPC ............... H01L 21/823814; H01L 27/092; H01L 29/161
See application file for complete search history.

(56) References Cited

U.S. PATENT DOCUMENTS

| | | |
|---|---|---|
| 5,847,419 A | 12/1998 | Imai et al. |
| 7,101,742 B2 | 9/2006 | Ko et al. |
| 7,557,010 B2 | 7/2009 | Chen et al. |
| 7,569,447 B2 | 8/2009 | Yang et al. |
| 7,674,669 B2 | 3/2010 | Hanafi |
| 7,871,915 B2 | 1/2011 | Lim et al. |
| 8,101,479 B2 | 1/2012 | Parker et al. |
| 8,134,204 B2 | 3/2012 | Benaissa et al. |
| 2002/0008289 A1 | 1/2002 | Murota et al. |

(Continued)

*Primary Examiner* — Brett Feeney
*Assistant Examiner* — Sophia Nguyen
(74) *Attorney, Agent, or Firm* — Seed IP Law Group PLLC

(57) ABSTRACT

Silicon germanium regions are formed adjacent gates electrodes over both n-type and p-type regions in an integrated circuit. A hard mask patterned by lithography then protects structures over the p-type region while the silicon germanium is selectively removed from over the n-type region, even under remnants of the hard mask on sidewall spacers on the gate electrode. Silicon germanium carbon is epitaxially grown adjacent the gate electrode in place of the removed silicon germanium, and source/drain extension implants are performed prior to removal of the remaining hard mask over the p-type region structures.

20 Claims, 11 Drawing Sheets

(56) References Cited

U.S. PATENT DOCUMENTS

| | | | |
|---|---|---|---|
| 2005/0035369 A1* | 2/2005 | Lin | H01L 21/823807 257/194 |
| 2006/0043498 A1* | 3/2006 | Orlowski | H01L 29/0847 257/396 |
| 2006/0258073 A1 | 11/2006 | Greene et al. | |
| 2007/0096149 A1* | 5/2007 | Liu | H01L 21/823807 257/192 |
| 2007/0134854 A1 | 6/2007 | Zhang et al. | |
| 2007/0190731 A1* | 8/2007 | Chen | H01L 21/26506 438/299 |
| 2008/0012018 A1* | 1/2008 | Waite | H01L 21/823807 257/69 |
| 2009/0032840 A1* | 2/2009 | Gluschenkov | H01L 21/26506 257/190 |
| 2009/0246922 A1* | 10/2009 | Wu | H01L 21/823807 438/231 |
| 2010/0197093 A1* | 8/2010 | Yang et al. | 438/231 |
| 2010/0221938 A1* | 9/2010 | Liu | B23K 20/10 439/152 |
| 2010/0224938 A1 | 9/2010 | Zhu | |
| 2011/0037125 A1* | 2/2011 | Cheng | H01L 21/84 257/351 |
| 2011/0070701 A1* | 3/2011 | Ning | H01L 21/823807 438/199 |
| 2011/0070703 A1 | 3/2011 | Xiong et al. | |
| 2011/0237039 A1* | 9/2011 | Yang et al. | 438/285 |
| 2011/0278673 A1 | 11/2011 | Fuller et al. | |
| 2011/0309446 A1* | 12/2011 | Doris | H01L 21/84 257/351 |
| 2012/0001254 A1 | 1/2012 | Kronholz et al. | |
| 2012/0007145 A1* | 1/2012 | Chen et al. | 257/192 |
| 2012/0052653 A1 | 3/2012 | Chidambarrao et al. | |
| 2012/0061759 A1* | 3/2012 | Cheng | H01L 29/66628 257/347 |
| 2012/0068261 A1 | 3/2012 | Kwon et al. | |
| 2012/0108021 A1* | 5/2012 | Mehrotra | H01L 21/823814 438/231 |
| 2012/0112208 A1* | 5/2012 | Adam | H01L 21/28525 257/77 |
| 2012/0241868 A1* | 9/2012 | Tsai | H01L 21/823807 257/369 |
| 2012/0273894 A1 | 11/2012 | Chen et al. | |
| 2013/0015525 A1* | 1/2013 | Cheng | H01L 21/0217 257/351 |
| 2013/0175632 A1 | 7/2013 | Cai et al. | |
| 2013/0175640 A1* | 7/2013 | Illgen | H01L 29/78 257/402 |
| 2013/0200456 A1 | 8/2013 | Zhu et al. | |
| 2013/0241004 A1 | 9/2013 | Yin et al. | |
| 2013/0264613 A1* | 10/2013 | Liao et al. | 257/288 |
| 2014/0024181 A1* | 1/2014 | Adam et al. | 438/154 |
| 2014/0327054 A1* | 11/2014 | Adam et al. | 257/288 |
| 2014/0349460 A1* | 11/2014 | Vinet et al. | 438/303 |
| 2015/0074621 A1* | 3/2015 | Endo et al. | 716/54 |
| 2015/0103328 A1* | 4/2015 | Motegi et al. | 355/72 |
| 2015/0104914 A1* | 4/2015 | Yang et al. | 438/238 |
| 2015/0114432 A1* | 4/2015 | Iwata et al. | 134/19 |

\* cited by examiner

DUAL EPI CMOS INTEGRATION FOR PLANAR SUBSTRATES

CROSS-REFERENCE TO RELATED APPLICATION(S)

This application is a division of U.S. patent application Ser. No. 13/679,434, filed Nov. 16, 2012, entitled "DUAL EPI CMOS INTEGRATION FOR PLANAR SUBSTRATES." The content of the above-identified patent document(s) is incorporated herein by reference.

TECHNICAL FIELD

The present disclosure relates generally to fabricating complementary metal oxide semiconductor integrated circuits and, more specifically, to epitaxial deposition of silicon germanium carbon layers in complementary metal oxide semiconductor integrated circuits.

BACKGROUND

Leading edge technologies require high performance operation at low-power. Epitaxial growth of silicon germanium carbon (often signified by any of "Si(Ge)(C)," "SiGe (C)" or "SiGe:C") layers can be an attractive solution to boost device performance. However n-channel metal oxide semiconductor (NMOS) and p-channel MOS (PMOS) transistors within complementary MOS (CMOS) designs require different epitaxies, creating challenges in protecting one type of transistor while performing epitaxy on the other transistor type. Conventional methods require patterning and the use of additional spacers on either NMOS or PMOS devices, which degrades device performance, makes integration very difficult, and leads to defects on the resulting circuits.

There is, therefore, a need in the art for an improved process for the epitaxial deposition of silicon germanium carbon layers during fabrication of CMOS integrated circuits.

SUMMARY

Silicon germanium regions are formed adjacent gate electrodes over both n-type and p-type regions in an integrated circuit. A hard mask patterned by lithography then protects structures over the p-type region while the silicon germanium is selectively removed from over the n-type region, even under remnants of the hard mask on sidewall spacers on the gate electrode. Silicon germanium carbon is epitaxially grown adjacent the gate electrode in place of the removed silicon germanium, and source/drain extension implants are performed prior to removal of the remaining hard mask over the p-type region structures.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

Figure 1A:
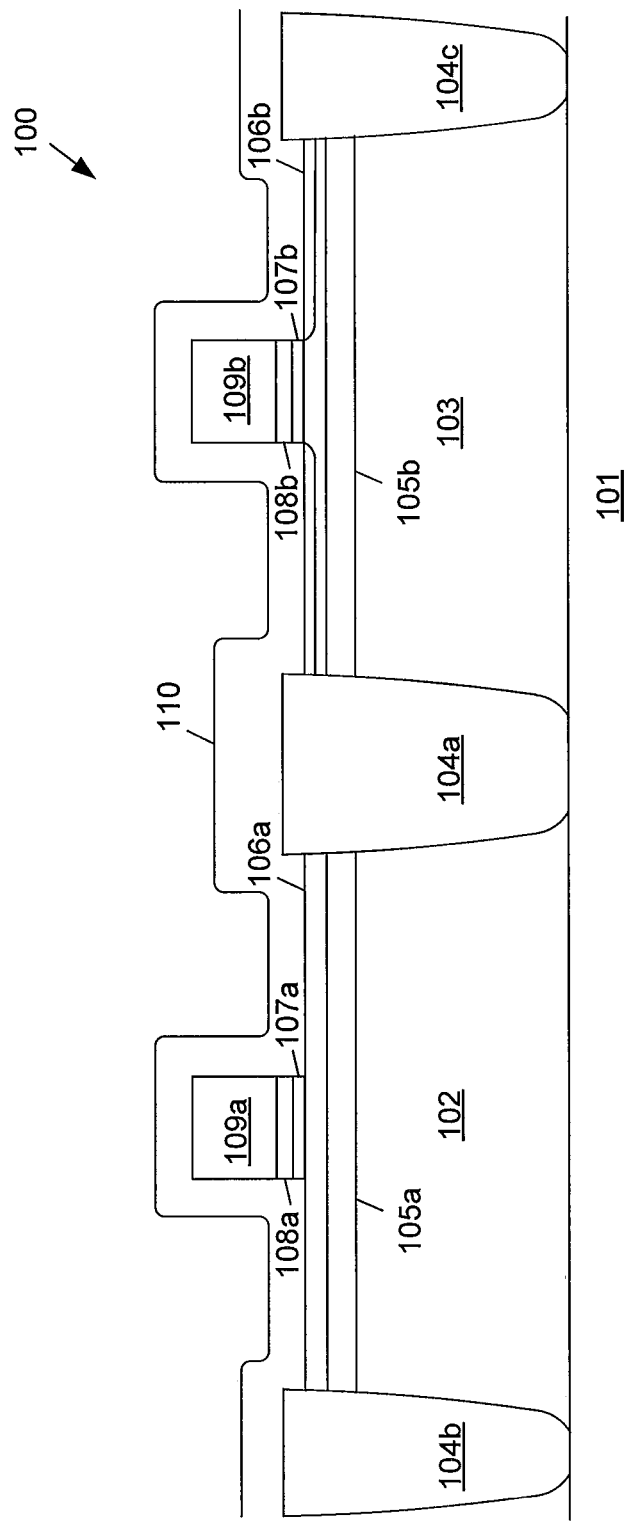
FIGS. 1A through 1J are sectional views of a portion of a semiconductor integrated circuit structure during a process of dual epitaxy CMOS integration for planar substrates in accordance with one embodiment of the present disclosure.
Figure 1B:
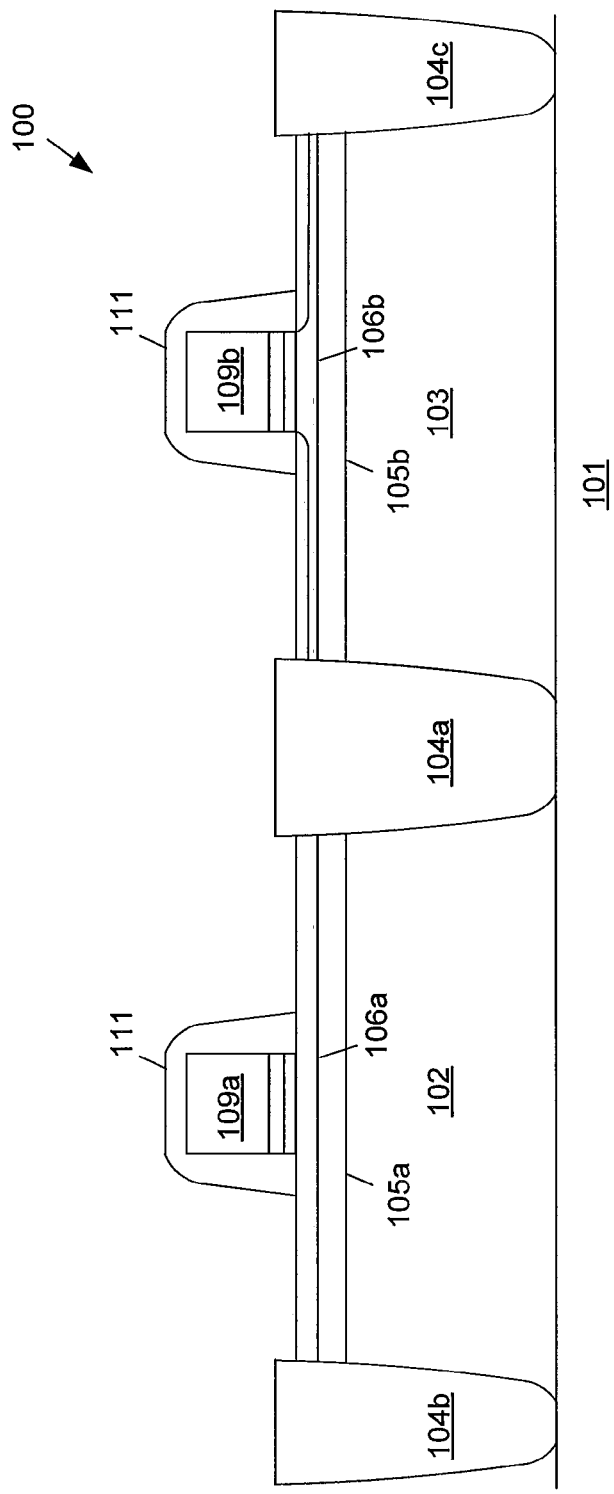
Figure 1C:
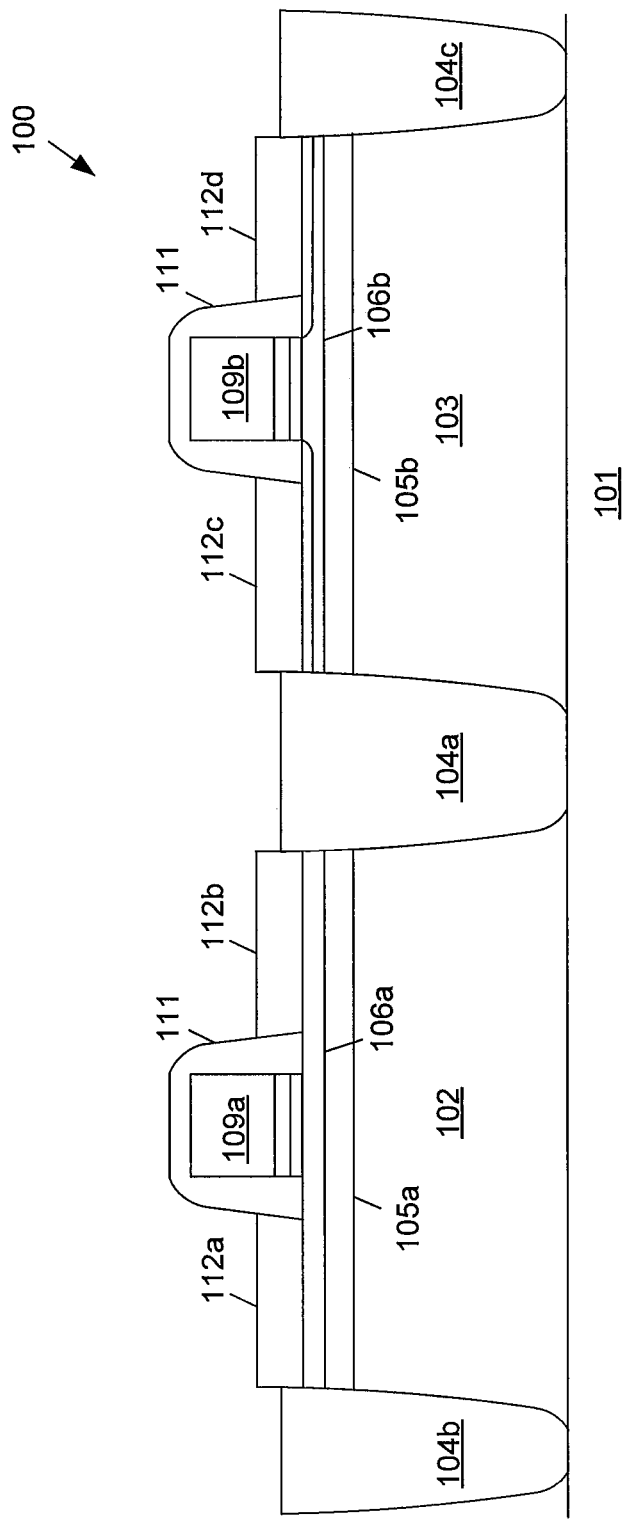
Figure 1D:
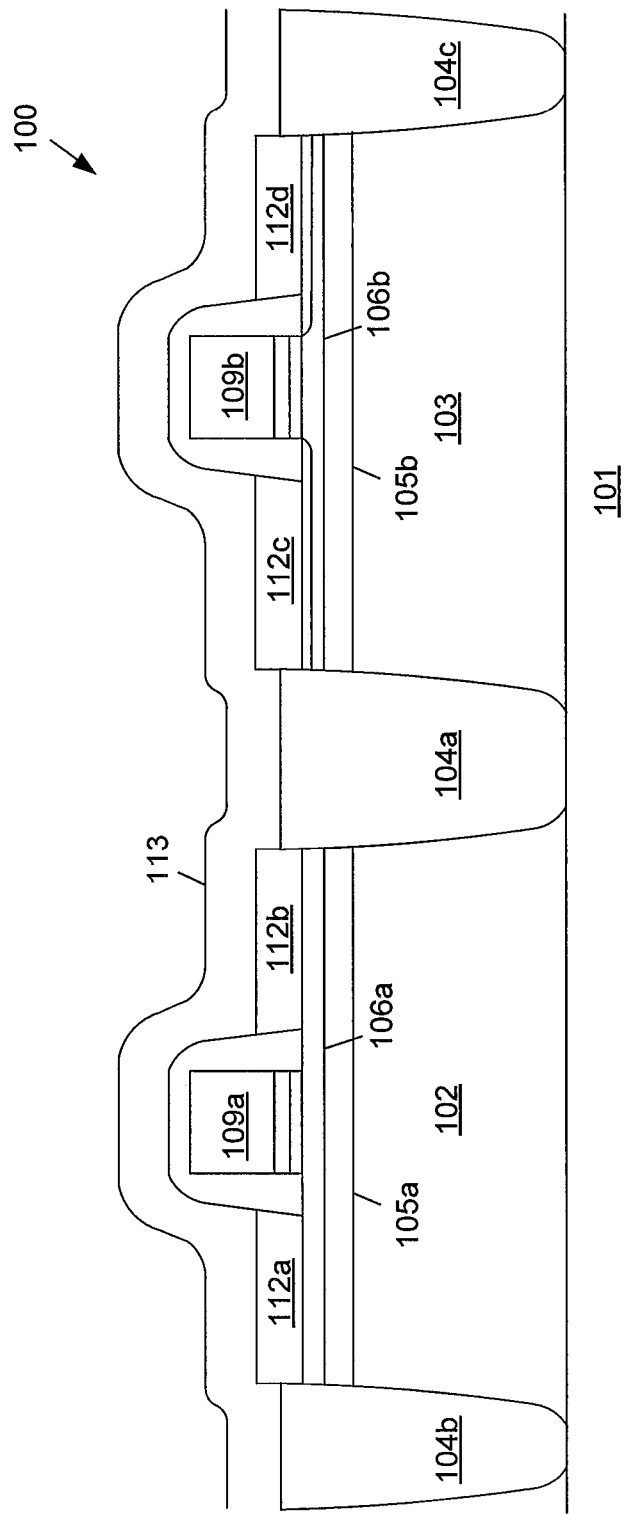
Figure 1E:
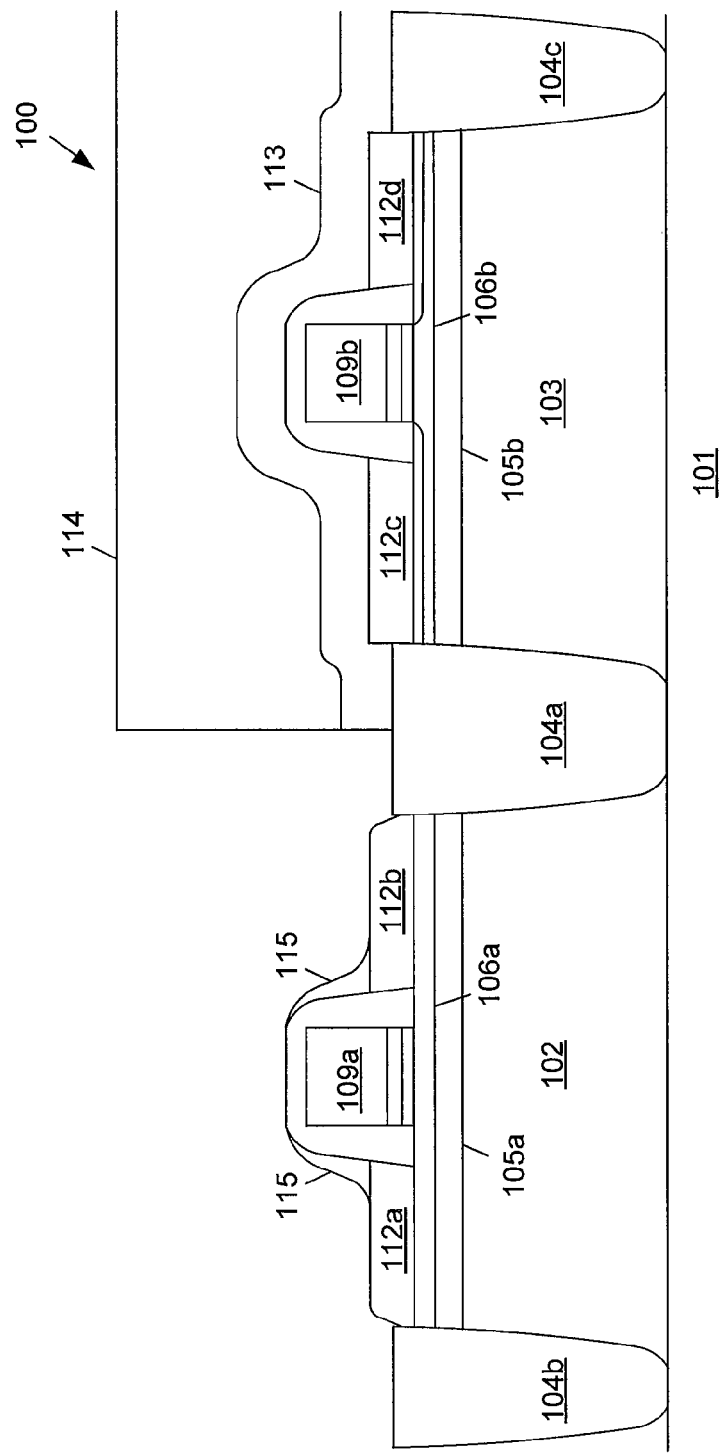
Figure 1F:
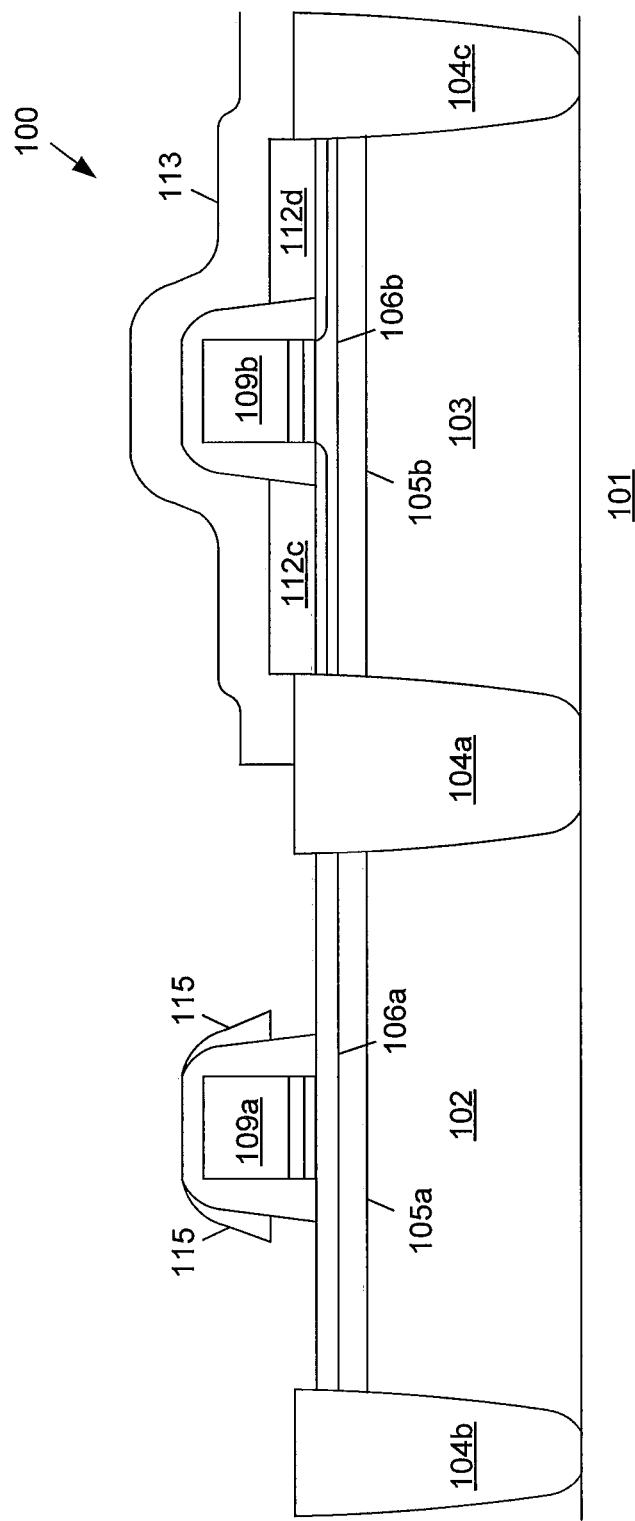
Figure 1G:
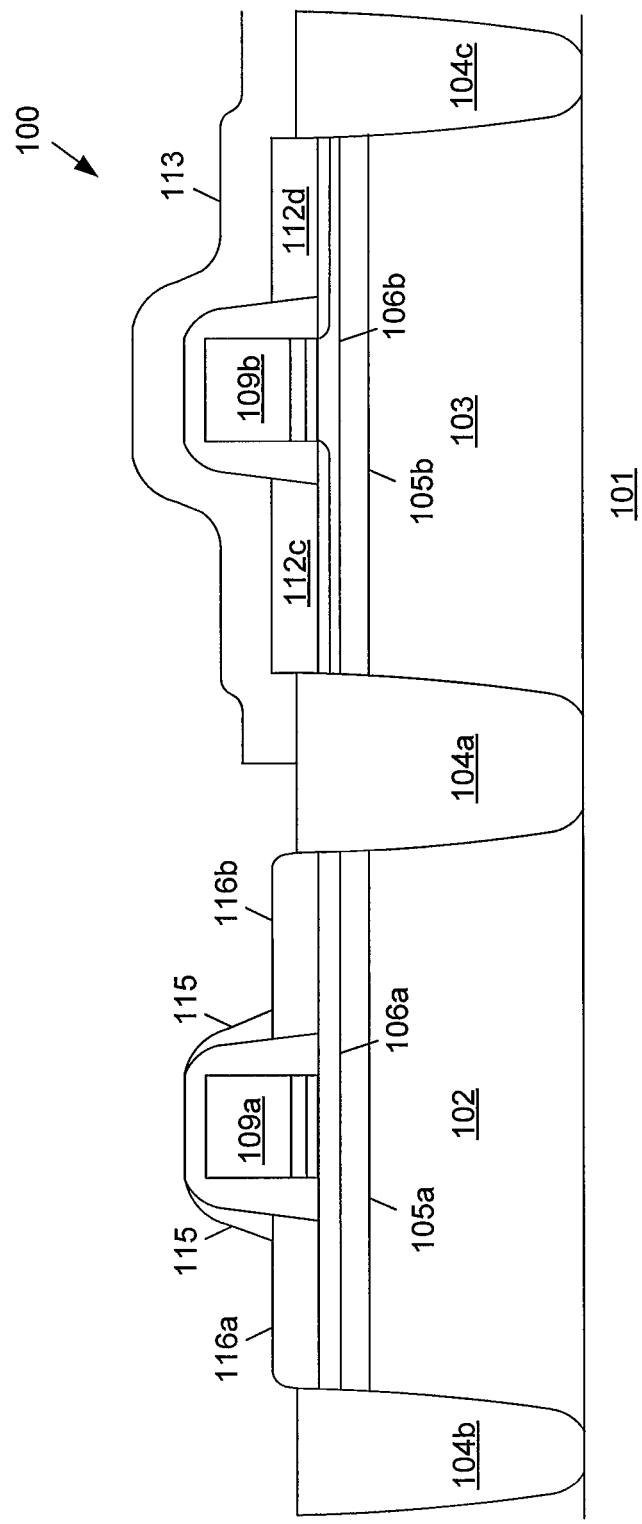
Figure 1H:
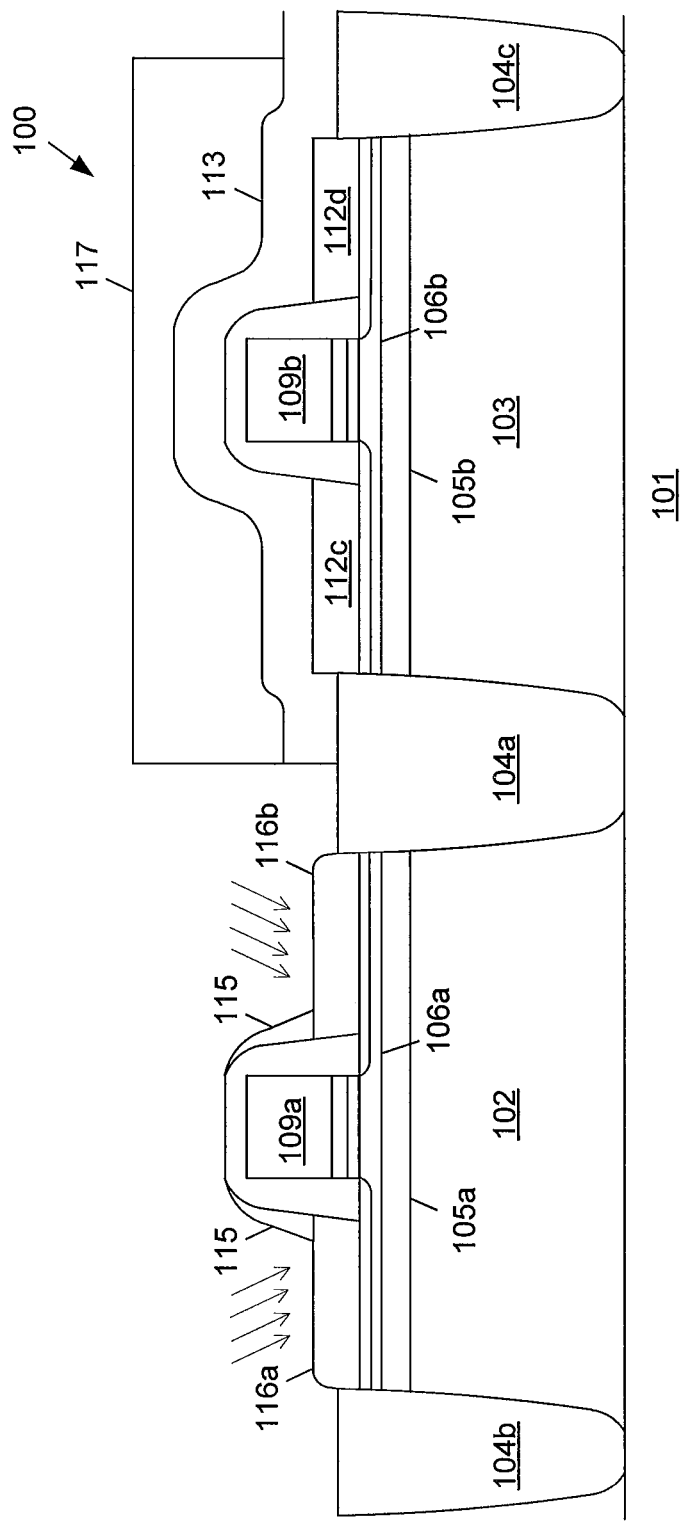
Figure 1I:
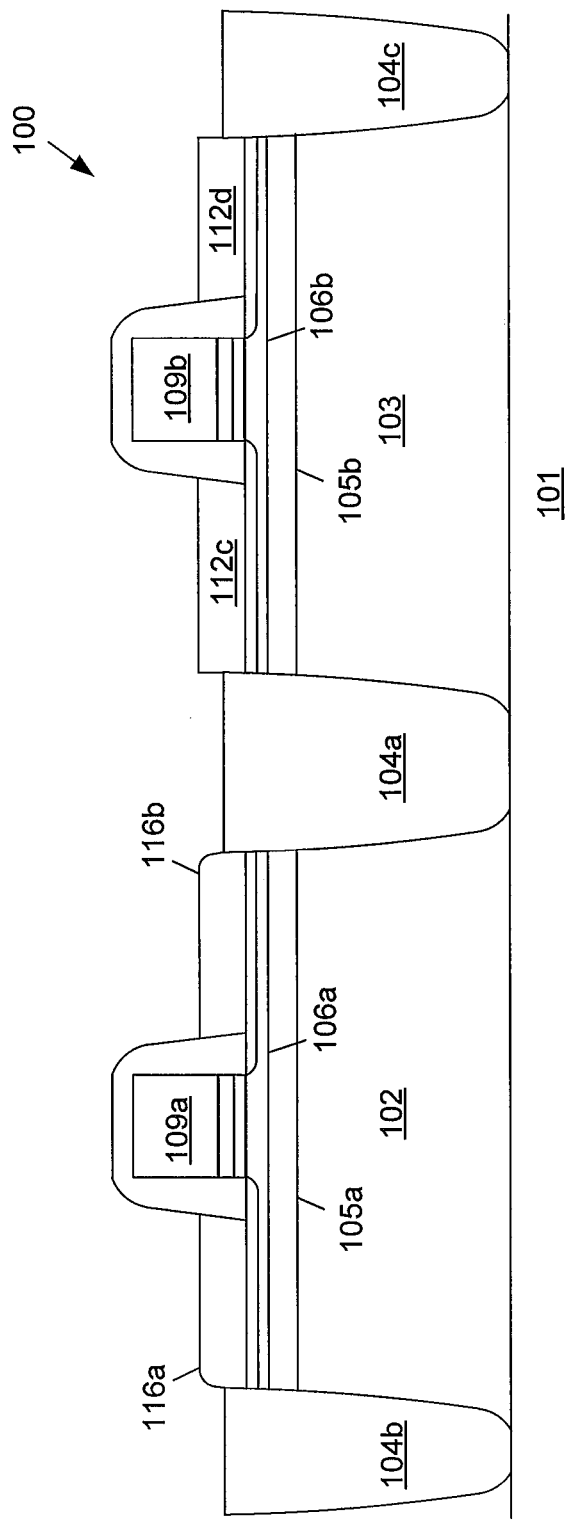
Figure 1J:
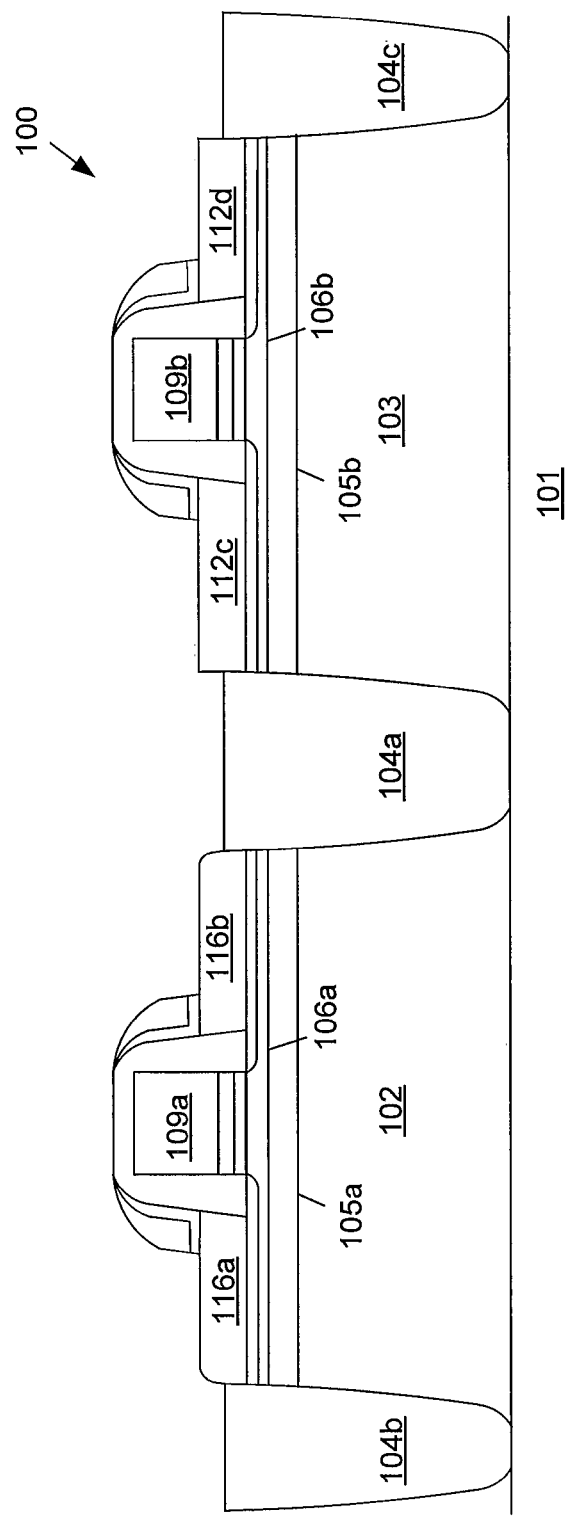
Figure 2:
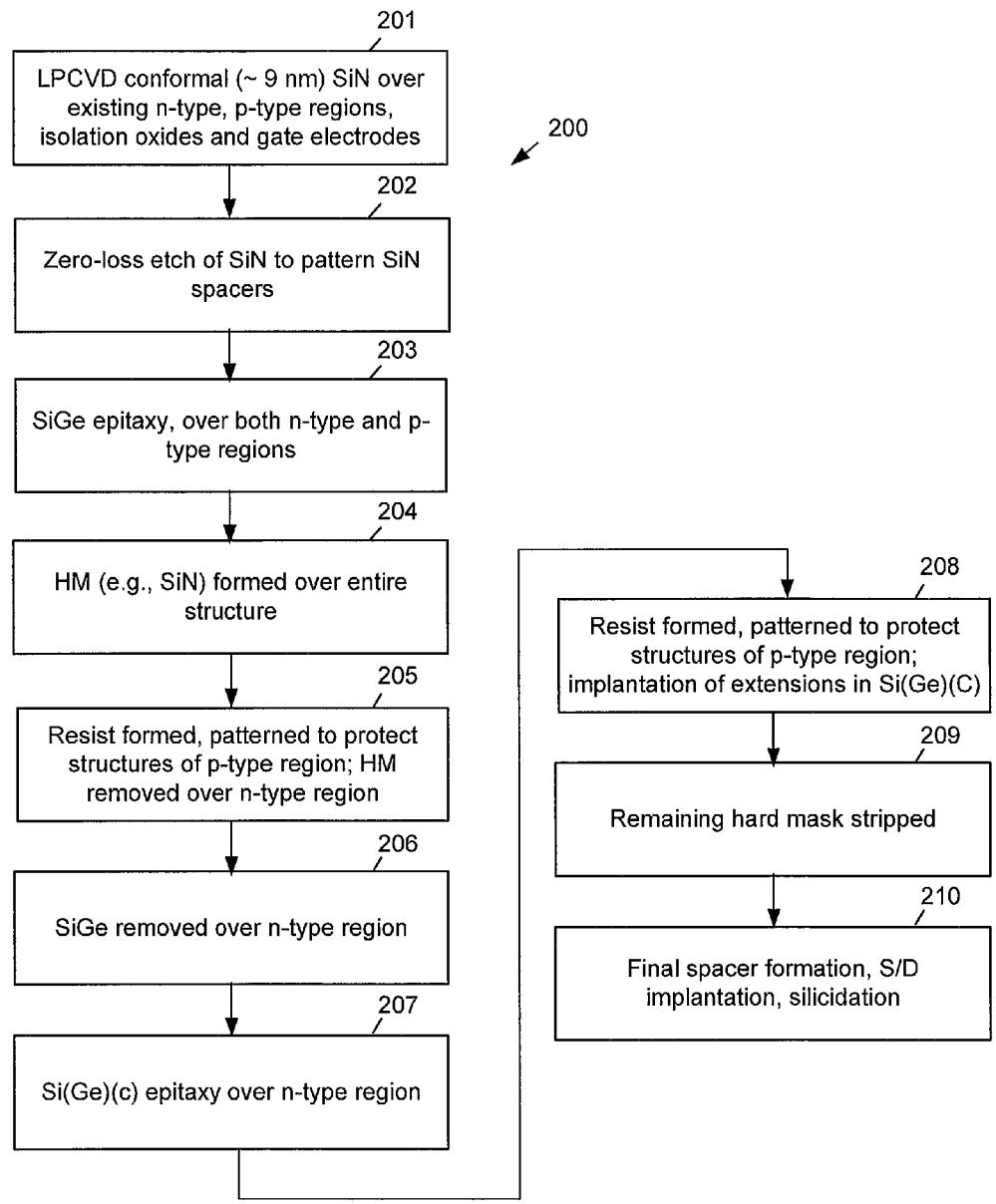
FIG. 2 is a high level flow chart illustrating a process of dual epitaxy CMOS integration for planar substrates in accordance with one embodiment of the present disclosure.

FIGS. 1A through 2, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system.

Integration with the PMOS-first scheme that means silicon germanium (SiGe) is first grown everywhere and a protective hard mask (HM) is used, followed by a lithography step. Then a simple HM reactive ion etch (RIE) is performed with a dry etch to remove the hard mask from over the epitaxial SiGe on the NMOS structure(s), but leaving the protective layer on the PMOS structures. The SiGe epitaxy on the NMOS structures is selectively removed using the etch properties of hydrogen chloride (HCl) gas to selectively remove SiGe as opposed to structure of only silicon (Si). Optionally the epitaxial SiGe layer on the NMOS structures is first amorphized with an implant and then selectively removed, as HCl gas can also remove amorphous SiGe layers selectively versus the corresponding monocrystalline phase of such layers.

FIGS. 1A through 1J are sectional views of a portion of a semiconductor integrated circuit structure during a process of dual epitaxy CMOS integration for planar substrates in accordance with one embodiment of the present disclosure. FIG. 2 is a high level flow chart illustrating a process of dual epitaxy CMOS integration for planar substrates in accordance with one embodiment of the present disclosure, and is discussed below in conjunction with FIGS. 1A through 1J. While only a single NMOS and PMOS transistor pair are illustrated, those skilled in the art will understand that the same structures are concurrently formed using the same process for many different CMOS transistor pairs on an integrated circuit die, and on many different die within a wafer.

Those skilled in the art will recognize that the structures of FIGS. 1A through 1J, while generally drawn to illustrate approximate relative sizes or dimensions, are not drawn to scale. Those skilled in the art will further recognize that the full process for forming an integrated circuit and the associated structures are not illustrated in the drawings or described herein. Instead, for simplicity and clarity, only so much of a process for forming an integrated circuit and the associated structures as is unique to the present disclosure or necessary for an understanding of the present disclosure is depicted and described. In addition, although various steps are illustrated in the drawings and described herein, no limitation regarding the order of such steps or the presence or absence of intervening steps is implied. Steps depicted or described as sequential are, unless explicitly specified, merely done so for purposes of explanation without precluding the possibility that the respective steps are actually performed in concurrent or overlapping manner, at least partially if not entirely.

Referring first to FIG. 1A, as a starting point for dual epitaxy CMOS integration in accordance with the present disclosure, an integrated circuit structure 100 includes an optional substrate 101 on which are formed regions 102-103 of semiconductor material (e.g., silicon) each doped with a different type of impurity to produce an n-type region 102 and a p-type region 103. The n-type region 102 and p-type region 103 are electrically isolated from each other by an isolation region 104a and from adjacent integrated circuit structures on the substrate 101 by isolation regions 104b and 104c, each of which may be formed of (for example) silicon dioxide. Layers 105a and 105b and layers 106a and 106b, which may be silicon dioxide and silicon, respectively, are formed over the n-type region 102 and p-type region 103. Layers 106a and 106b may be either doped or undoped, and/or doped regions may be formed in layer 106b (or in both layers 106a and 106b). Gate electrodes for transistors are formed on the Si layers 106a and 106b, and in the exemplary embodiment each include a hafnium silicon oxide nitride (HfSiON) gate insulator 107a and 107b, a titanium nitride (TiN) barrier layer 108a and 108b, and polysilicon gate electrode 109a and 109b.

The dual epitaxy CMOS integration process 200 according to the present disclosure begins with low pressure chemical vapor deposition (LPCVD) formation of a conformal silicon nitride (SiN) layer 110 (step 201) to a thickness of approximately 9 nanometers (nm) over all of the exposed structures (i.e., both gate electrodes and the adjacent exposed portions of silicon (Si), as well as isolation regions 104a through 104b). As illustrated in FIG. 1B, zero-loss etching is performed (step 202) to etch and pattern the silicon nitride layer 110, forming SiN spacers 111. In the exemplary embodiment, the etching and patterning of SiN layer 110 is performed using first a solution of hydrofluoric acid diluted with ethylene glycol (HFEG), then reactive ion etching to directionally remove portions of the SiN layer 110 while leaving substantial thicknesses of SiN on sidewalls of the gate electrodes, and finally etching with hydrofluoric (HF) acid to remove any remaining SiN over the layers 106a and 106b, leaving the SiN spacers 111 adjacent both sides of the gate electrodes.

As illustrated in FIG. 1C, epitaxy is then performed (step 203) to grow SiGe regions 112a, 112b, 112c and 112d on the exposed surfaces of the layers 106a and 106b, between the SiN spacers 111 and the isolation regions 104a, 104b and 104c. The SiGe regions 112a, 112b, 112c and 112d may be formed with impurity types and concentrations suitable for the device to be formed over the p-type region 103. As illustrated in FIG. 1D, a hard mask (HM) 113 is then formed (step 204) over the entire structure 100. Any hard mask material, such as silicon nitride, may be utilized. As shown in FIG. 1E, a photoresist 114 is formed over the hard mask 113 and patterned, to allow selective removal by RIE of the hard mark 113 over the n-type region 102 (step 205), except for portions or remnants 115 adjacent the gate electrode. Over etch with a SiN RIE relative to the SiGe layers 112a and 112b is possible due to the selectivity of the SiN RIE process. The hard mask remnants 115 over the n-type region remain due to the directional nature of the SiN RIE but are not necessary to the process flow and do not serve the functions of additional sidewall spacers in other processes. Instead, a selective etch allows the SiGe regions 112a and 112b adjacent the gate electrode over the n-type region 102 to be removed, even under the hard mask remnants 115. Epitaxial growth then allows formation of Si(Ge)(C) regions in place of the SiGe regions 112a and 112b. No additional spacers adjacent the gate electrode are necessary for removal of the SiGe regions 112a and 112b and epitaxial growth of Si(Ge)(C) in place thereof.

Referring to FIG. 1F, the resist 114 is then stripped, a preclean is performed and the SiGe over the n-type region 102 is removed by HCl etch (step 206). As shown in FIG. 1G, epitaxy is then performed (step 207) to grow Si(Ge)(C) regions 116a and 116b on exposed surfaces of layer 106a. The Si(Ge)(C) regions 116a and 116b are formed in place of the previously-removed SiGe regions 112a and 112b, including under the hard mask remnants 115. A resist 117 is formed and patterned over p-type region 103 to allow implantation of borophosphate (BP) extensions within layer 106a (step 208), as illustrated in FIG. 1H. As depicted in FIG. 1I, the resist 117 is stripped, and the hard mask 113 over the p-type region 103 and the remaining portions of the hard mask over the n-type region 102 are removed (step 209). Final spacer formation, source/drain (S/D) implantation, and silicidation are then performed (step 210), as depicted in FIG. 1J.

The present disclosure avoids the need to form and pattern separate spacers adjacent the gate electrode for either the NMOS or PMOS transistors in order to form Si(Ge)(C) regions. Based on the selectively of etchants for SiGe versus the (SiN) hard mask, SiGe regions may be removed from under hard mask remnants adjacent the gate. Si(Ge)(C) regions may then be epitaxially grown under those hard mask remnants. Integration of Si(Ge)(C) formation in an integrated circuit fabrication process flow is thus simplified, with less detrimental impact on device performance and defect rates.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. A method, comprising:
forming silicon germanium (SiGe) regions adjacent gate electrodes over both n-type and p-type regions;
forming and patterning a hard mask over structures in the p-type region;
selectively removing, relative to the hard mask, the silicon germanium regions adjacent the gate electrode over the n-type region;
epitaxially growing silicon germanium carbon (Si(Ge)(C)) regions adjacent the gate electrode over the n-type region in place of the removed silicon germanium regions; and
implanting source/drain extensions in a layer underlying the silicon germanium carbon regions.

2. The method according to claim 1, wherein the hard mask comprises silicon nitride (SiN), and wherein remnants of the hard mask remain on spacers adjacent the gate electrode over the n-type region and over the silicon germanium regions when the hard mask is patterned.

3. The method according to claim 2, further comprising removing portions of the silicon germanium regions adjacent the gate electrode over the n-type region and under the hard mask remnants.

4. The method according to claim 3, wherein the silicon germanium carbon is grown under the hard mask remnants.

5. The method according to claim 4, further comprising:
after epitaxially growing the silicon germanium carbon regions adjacent the gate electrode over the n-type region and under the hard mask remnants, removing the hard mask remnants.

6. The method according to claim 5, wherein implanting the source/drain extensions occurs prior to removing the hard mask remnants.

7. The method according to claim 1, wherein the hard mask remains over structures in the p-type region during selective removal of the silicon germanium regions adjacent the gate electrode over the n-type region and epitaxial growth of silicon germanium carbon regions adjacent the gate electrode over the n-type region in place of the removed silicon germanium regions.

8. The method according to claim 1, wherein the silicon germanium regions abut sidewall spacers on the gate electrode over the n-type region.

9. The method according to claim 1, wherein the hard mask is formed of silicon nitride.

10. The method according to claim 9, further comprising using hydrochloric acid (HCl) to remove the silicon germanium regions adjacent the gate electrode over the n-type region without removing remnants of the hard mask.

11. A method, comprising:
forming silicon germanium (SiGe) regions adjacent a first gate electrode over a n-type region of a substrate and a second gate electrode over a p-type region of the substrate;
forming and patterning a hard mask over structures in the p-type region, wherein remnants of the hard mask remain on spacers adjacent the first gate electrode over the n-type region and remain over the SiGe regions adjacent the first gate electrode over the n-type region;
amorphizing the SiGe regions adjacent the first gate electrode over the n-type region with an implant;
removing the amorphized SiGe regions; and
epitaxially growing regions containing at least silicon and germanium adjacent the first gate electrode over the n-type region.

12. The method according to claim 11, wherein the SiGe regions adjacent the first gate electrode over the n-type region are formed concurrently with the SiGe regions adjacent the second gate electrode over the p-type region.

13. The method according to claim 11, wherein the regions containing at least silicon and germanium adjacent the first gate electrode over the n-type region are silicon germanium carbon (Si(Ge)(C)) regions epitaxially grown under the hard mask remnants.

14. The method according to claim 13, further comprising:
removing the hard mask remnants after epitaxially growing the Si(Ge)(C) regions adjacent the first gate electrode over the n-type region and under the hard mask remnants.

15. A method, comprising:
forming silicon germanium (SiGe) regions adjacent gate electrodes over both n-type and p-type regions separated by an isolation region;
forming a hard mask over both n-type and p-type regions;
patterning the hard mask to selectively remove hard mask material from over structures in the n-type region while leaving hard mask material over structures in the p-type region;
selectively removing the SiGe regions adjacent the gate electrode over the n-type region;
epitaxially growing silicon germanium carbon (Si(Ge)(C)) regions adjacent the gate electrode over the n-type region in place of the removed SiGe regions; and
implanting borophosphate extensions in a layer underlying the Si(Ge)(C) regions;
removing remaining hard mask material.

16. The method according to claim 15, further comprising:
forming spacers adjacent the gate electrodes over both n-type and p-type regions, the spacers including silicon nitride (SiN); and
etching and patterning the spacers.

17. The method according to claim 15, wherein patterning the hard mask includes:
forming a resist over the hard mask and applying a pattern to the resist and the hard mask using lithography;
stripping the resist; and
removing portions of the hard mask using a reactive ion etch (RIE).

18. A method, comprising:
forming silicon germanium (SiGe) regions adjacent gate electrodes over both n-type and p-type regions separated by an isolation region;
forming a hard mask over both n-type and p-type regions;
patterning the hard mask to selectively remove hard mask material from structures in the n-type region while leaving hard mask material over structures in the p-type region;
selectively removing the SiGe regions adjacent the gate electrode over the n-type region;
epitaxially growing silicon germanium carbon (Si(Ge)(C)) regions adjacent the gate electrode over the n-type region in place of the removed SiGe regions;
forming and patterning a resist over the hard mask material over structures in the p-type region;
implanting borophosphate extensions in a layer underlying the silicon germanium carbon (Si(Ge)(C)) regions;
removing the hard mask; and
removing the resist.

19. The method according to claim 18, comprising:
forming spacers adjacent the gate electrodes over both n-type and p-type regions, the spacers including silicon nitride (SiN).

20. A method, comprising:
forming silicon germanium (SiGe) regions adjacent gate electrodes over both n-type and p-type regions of a semiconductor substrate, the n-type and p-type regions separated by an isolation region;
forming a hard mask over both n-type and p-type regions;
patterning the hard mask to selectively remove hard mask material from structures in the n-type region while leaving hard mask material over structures in the p-type region;
selectively removing the SiGe regions adjacent the gate electrode over the n-type region;
epitaxially growing silicon germanium carbon (Si(Ge)(C)) regions adjacent the gate electrode over the n-type region in place of the removed SiGe regions;
implanting source/drain extensions in a layer underlying the silicon germanium carbon (Si(Ge)(C)) regions; and
removing the hard mask.

* * * * *